United States Patent [19]
Kim et al.

[11] Patent Number: 5,991,157
[45] Date of Patent: Nov. 23, 1999

[54] MODULE OF ENCLOSURE FOR ELECTRONIC CARDS

[75] Inventors: David K. J. Kim; Barry Marshall, both of San Jose; Ronald Barnes, Livermore, all of Calif.

[73] Assignee: Sun Microsystems, Inc., Mountain View, Calif.

[21] Appl. No.: 09/052,872

[22] Filed: Mar. 31, 1998

[51] Int. Cl.[6] .................................................. H05K 7/20
[52] U.S. Cl. ............................................ 361/719; 361/785
[58] Field of Search ................................. 174/16.3, 252, 174/35 R; 454/184; 165/121–126, 80.3, 185; 361/687, 690, 694, 695, 704, 705, 707, 717–719, 784, 785

[56] References Cited

U.S. PATENT DOCUMENTS

| | | |
|---|---|---|
| 4,557,225 | 12/1985 | Sagues . |
| 5,282,111 | 1/1994 | Hopfer . |
| 5,285,350 | 2/1994 | Villaume . |
| 5,589,311 | 12/1996 | Sano . |
| 5,590,026 | 12/1996 | Warren . |
| 5,662,163 | 9/1997 | Mira . |
| 5,754,409 | 5/1998 | Smith . |
| 5,854,738 | 12/1998 | Bowler . |
| 5,870,284 | 2/1999 | Stewart . |

*Primary Examiner*—Gerald Tolin
*Attorney, Agent, or Firm*—Julian Caplan; Flehr Hohbach Test; Albritton & Herbert LLP

[57] ABSTRACT

A module consists of a shroud or enclosure attached to a card containing heat-emitting electronic components or to a stack of two or more vertically spaced cards; one or all of which have heat sinks in thermal contact with at least some of the electronic components. The shroud is apertured to control air flow in many directions over the components and heatsinks. A hinge member extends along one edge of the module shaped to be inserted in a slot in a panel to establish a hinge. As the shroud is pivoted about the hinge, horizontal electrical contacts on the panel and at least one card interengage and vertical contacts on one of the cards remote from the hinge simultaneously interengage. The contour of the shroud aids in installing or removing the module.

17 Claims, 8 Drawing Sheets

MODULE OF ENCLOSURE FOR ELECTRONIC CARDS

CROSS REFERENCE TO RELATED APPLICATIONS

Reference is made to application Ser. No. 09/052,817, filed Mar. 31, 1998, entitled Interfitting Heatsink and Heat Spreader Slug, by Applicants.

BACKGROUND OF THE INVENTION

1. Field of the Invention

This invention relates to a new and improved module of enclosure for electronic cards. More particularly, the invention relates to a module comprising one or more card-like members containing heat emitting electronic components, some of which may be associated with heatsinks and a shroud or enclosure protecting the tops of the uppermost card. The module also has one or more protrusions which fit through corresponding slots in a panel of a computer or the like in a hinge-forming manner. Pin connector elements mounted both in horizontal and vertical orientation on the module may be interengaged with those on the computer as the module is pivoted about the hinge axis from a downward-rearward slanted position to a horizontal position.

2. Related Art

Applicants are not aware of any prior module having the characteristics and advantages of the present invention.

SUMMARY OF THE INVENTION

A principal purpose of the present invention is to provide a shroud which protects the electronic components and heatsinks of the module during handling, installation, and removal of the module in a computer housing. The shroud has a shape and a pattern of slots which facilitate air flow through the module in many directions to effectively cool the components.

The shape of the shroud has an ergonomic design to fit the palm of the user and to help grip the module and to guide the module in its pivotal hinge movement during installation and removal.

The shroud has a special groove design which fits around an edge of one of the cards which distributes localized mechanical stresses during installation and removal and further limits warping of the card or PCB to which the shroud is attached.

Another feature of the invention is the rear panel hinge design which guides interconnection or disconnection of the connectors during installation or removal of the module. The hinge interfits through the rear panel which is formed with a groove so that EMI shielding materials are compressed during installation of the module and are thereby made more effective.

One or more of the cards of the module may contain one or more heatsinks. The height of the heatsink and the spacing between the heatsink and the card is subject to variation. The use of the shroud of the present invention permits considerable variation in design of the electronic components and the use of heatsinks on selected components without interfering with the installation of the module in the computer.

BRIEF DESCRIPTION OF THE DRAWINGS

The accompanying drawings, which are incorporated in and form a part of this specification, illustrate embodiments of the invention and, together with the description serve to explain the principles of the invention.

DETAILED DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Module 11 which incorporates the present invention is subject to considerable variation, as will readily occur to one skilled in the art. As illustrated and hereinafter described, module 11 comprises a lower card or board 12 (which may be a graphics card having heat sinks 27 therein), an upper card or board 13 spaced above lower card 12 and a shroud or enclosure 14 above card 13. It will be understood that the number of cards 12, 13 is subject to considerable variation. Instead of graphics cards, other cards and pwb's may be substituted. Cards 12 and 13 are spaced from each other by tubular spacers 16 held in place by screws 17.

One of the advantages of the invention is the ease of attachment of horizontal connectors 18 located on the rear edge of lower card 12 to mating connectors (not shown) in the computer in which the module is installed. As will hereinafter appear, the connectors 19 are "blind" during installation and removal of module 11. The proper interfitting of the sockets and pins of the connectors is important, and the present invention facilitates proper connections. At the same time, there may be one or more vertical connectors 19, here shown adjacent the forward edge of module 1 1. As will readily occur to one skilled in the art, the number and positioning of the connectors 19 is subject to considerable variation.

A number of electronic components 21 are mounted on card 13, the number and location of which are also subject to wide variation. As shown, there are no heat sinks associated with components 21. However, there is space between card 13 and shroud 14 for such heat sinks if required. Card 13 is formed with apertures 22 for screws 17 at appropriate intervals.

Components 26 are mounted on card 12. Heat sinks 27 are associated with some of the components 26. In order to mount module 11 in the computer or other device for which it is intended, lower card 12 is provided with first upward extension 28. It will be understood that although the extension 28 is provided on card 12, it likewise might be provided on card 13. First rearward extension 29 is located on the upper edge of extension 28 and at the rear of extension 29 is second upward extension 31 and on the upper end thereof is the second rearward extension 32. Extension 32 provides a portion of a hinge mounting enabling the module 11 to pivot about a horizontal axis during installation and removal. Panel 36 may be any panel in a computer or other device formed with horizontally extending slots 37 to receive second rearward extensions 32. EMI material 38 may be installed on either side of panel 36 above extension 32. To hold the material 38 in place, upward bent portion 41 may be formed in extension 29 or in other suitable portions of the card 12.

Figure 1:
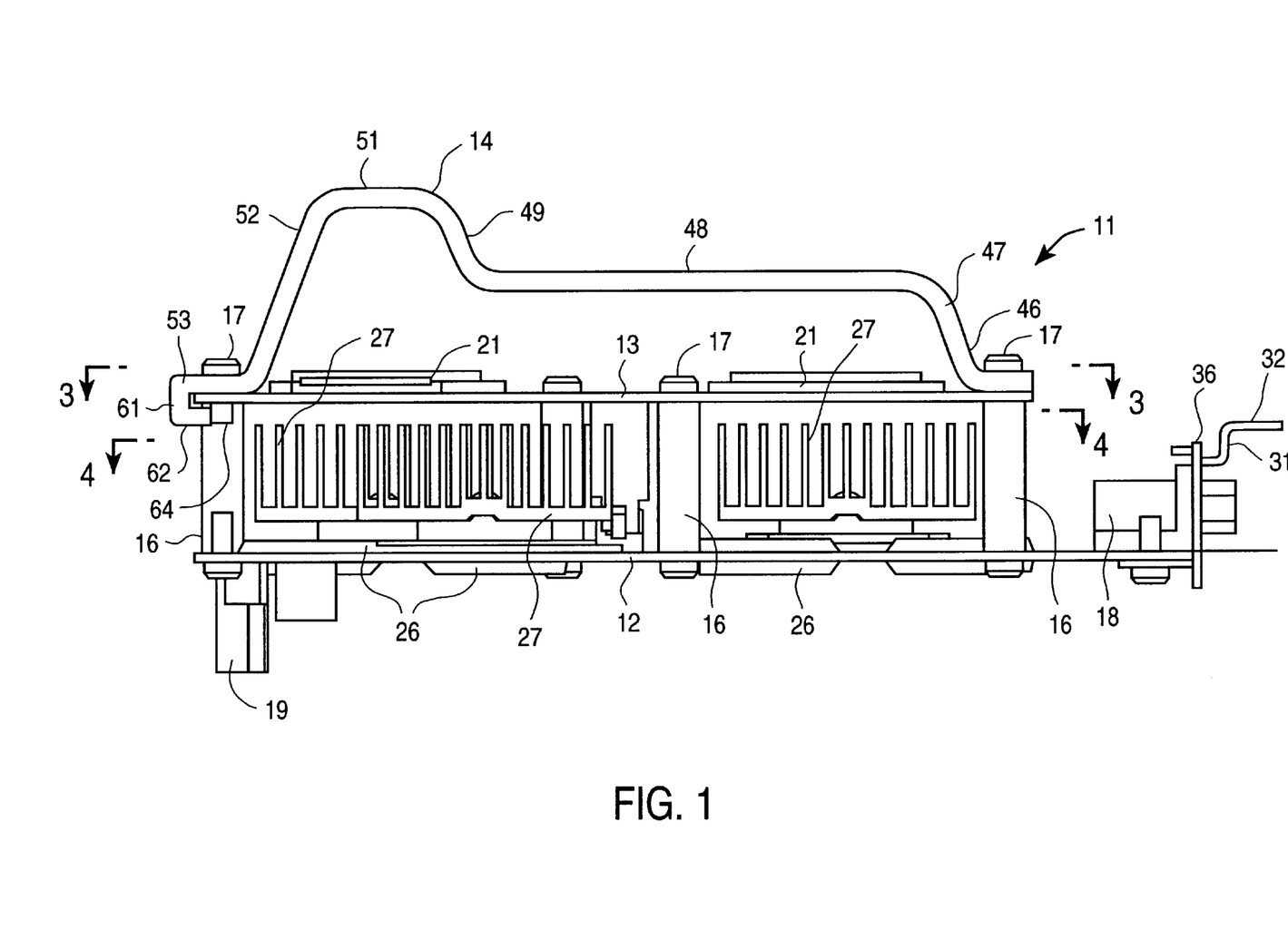
FIG. 1 is a side elevational view of the module of the present invention.
Figure 2:
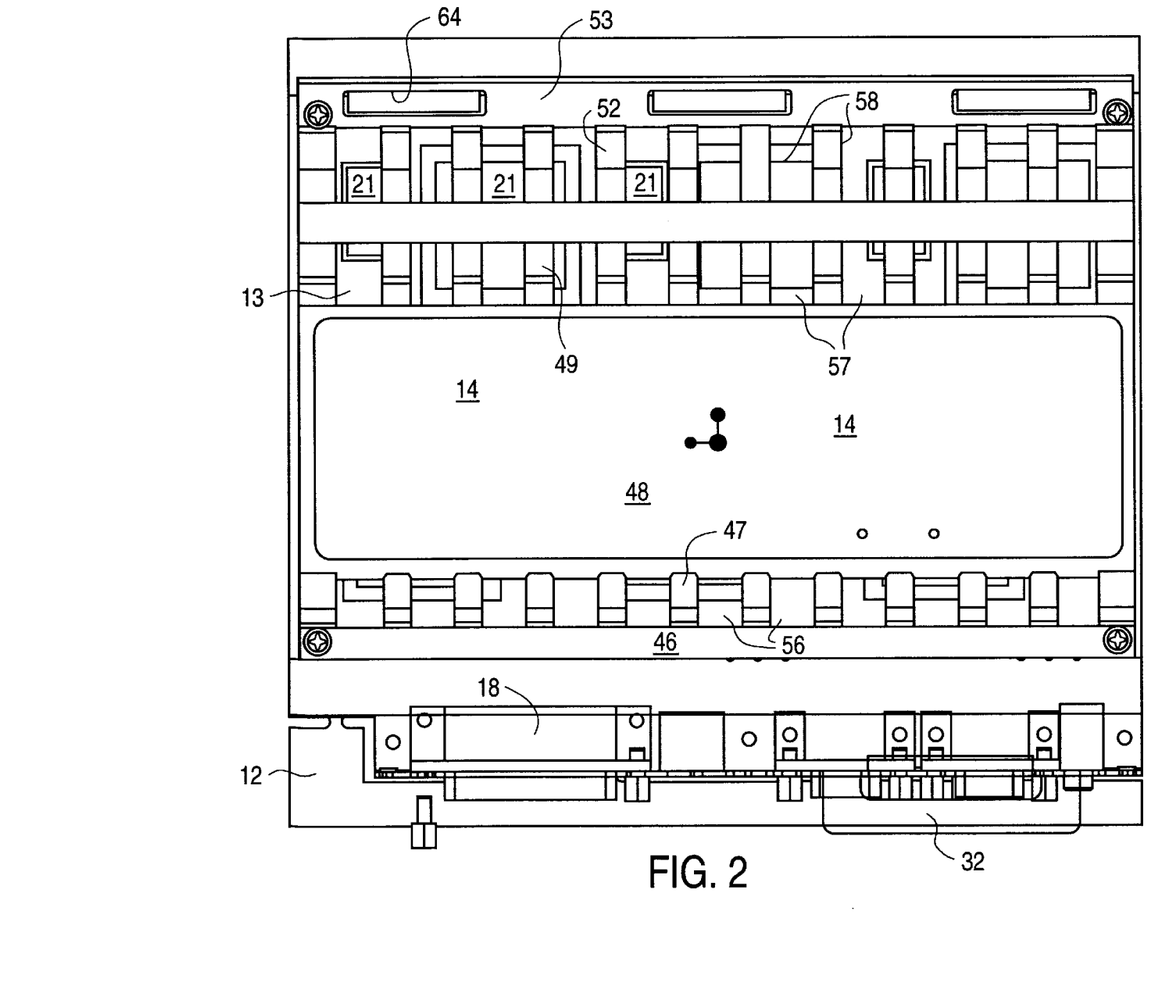
FIG. 2 is a top plan in view thereof.
Figure 3:
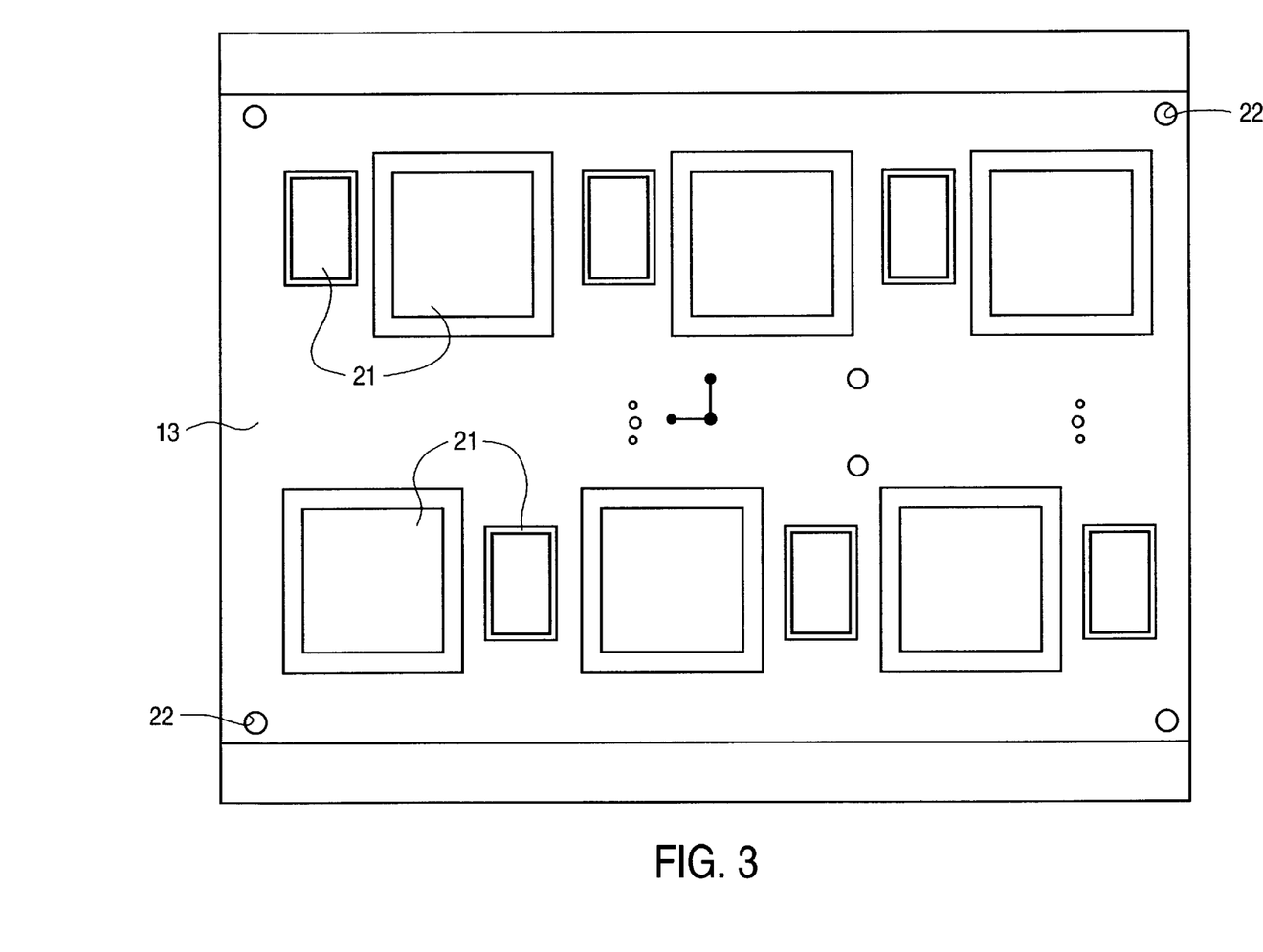
FIG. 3 is a sectional view taken substantially along the line 3—3 of FIG. 1.
Figure 4:
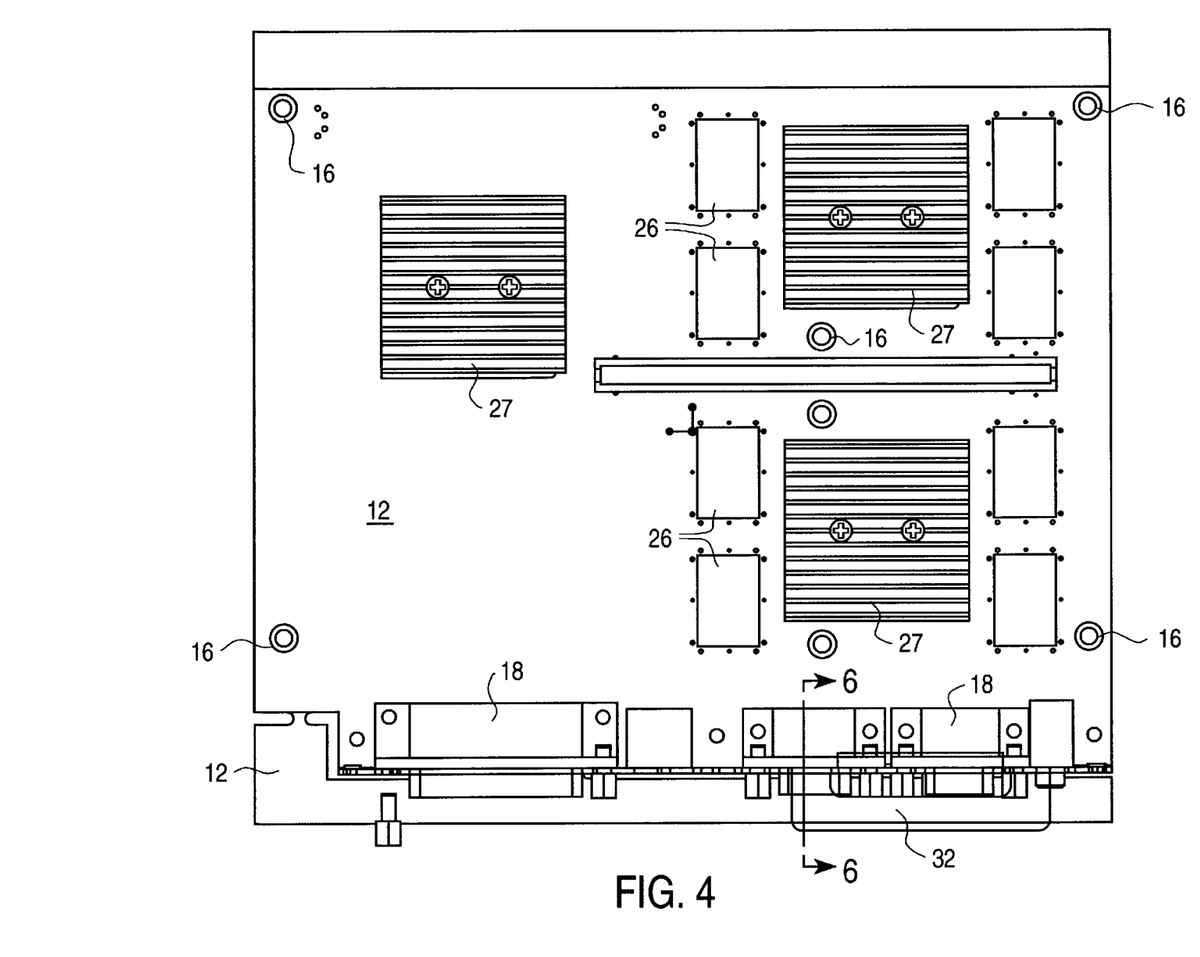
FIG. 4 is a schematic sectional view taken substantially along the line 4—4 of FIG. 1.
Figure 5:
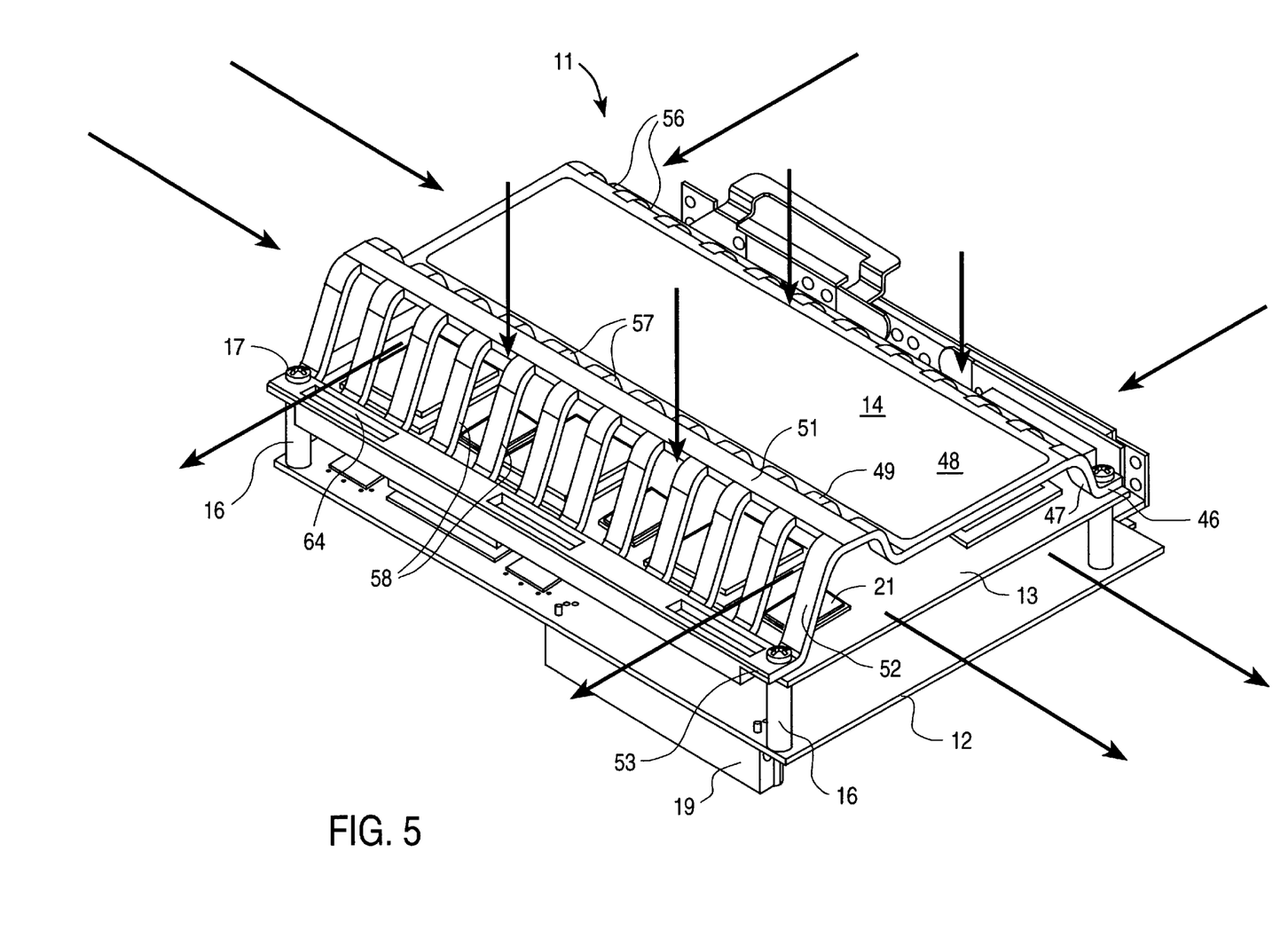
FIG. 5 is a perspective view showing airflow through the module.
Figure 6:
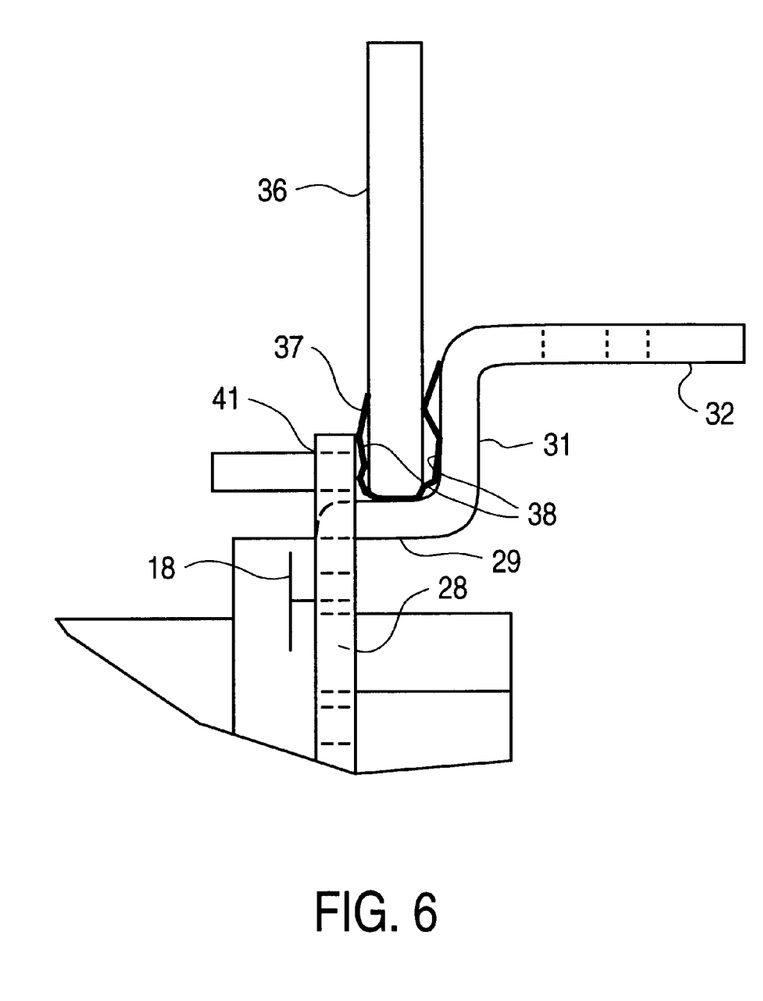
FIG. 6 is an enlarged fragmentary sectional view taken substantially along the line 6—6 of FIG. 4.
Figure 7:
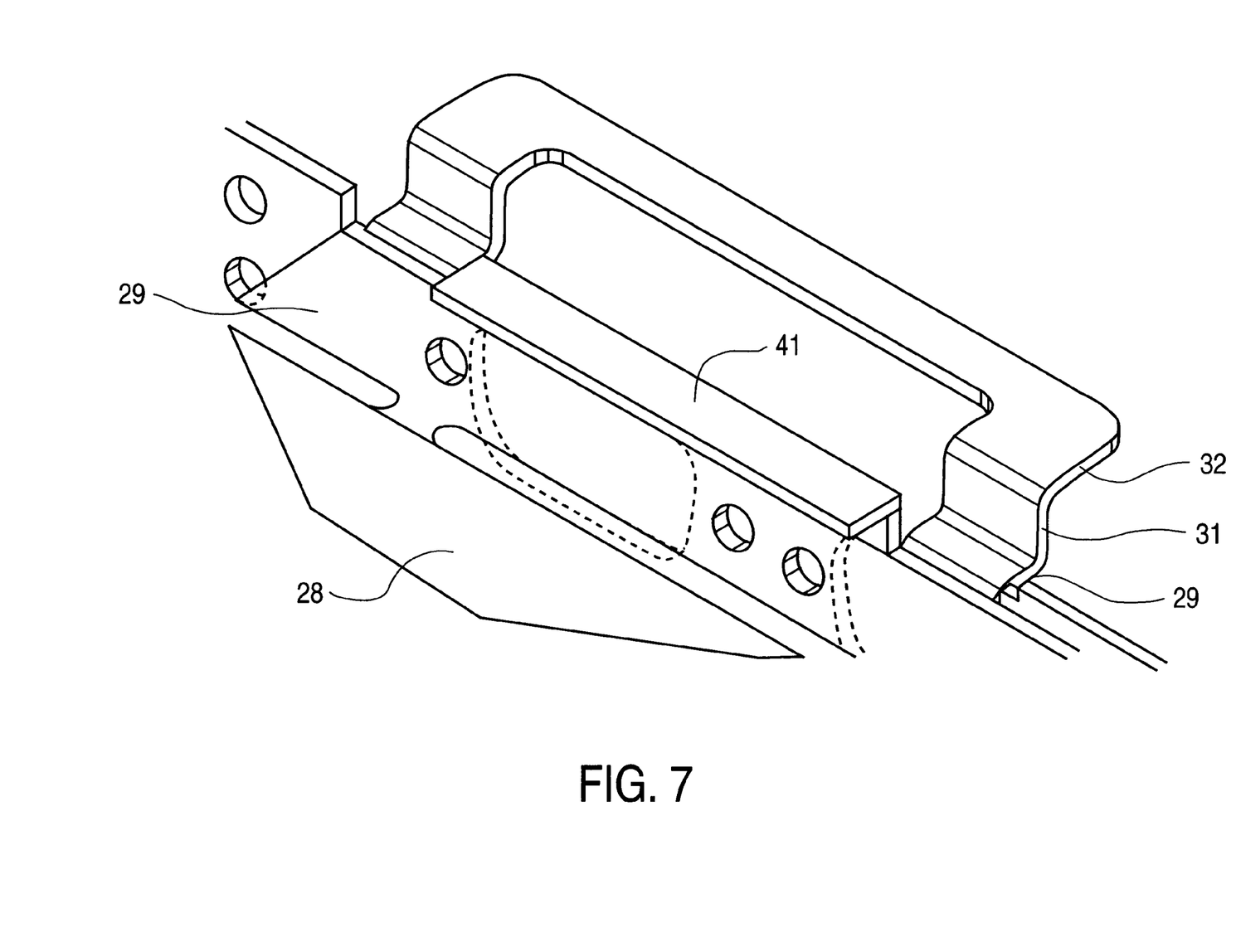
FIG. 7 is a perspective view of some of the structure of FIG. 6.

Shroud 14 provides protection above the components 21 and also facilitates forming the hinge between extension 32 of card 12 and the slotted panel 36. Shroud 14 has a horizontal rearward foot 46 which is substantially coterminous with a rearward edge of card 13 and is suitably apertured so that the same screws 17 which attach card 13 to spacer 16 likewise attach foot 46. Preceding forwardly, shroud 14 comprises an upwardly-forwardly slanted stretch 47, a forwardly extending horizontal portion 48, an upward-forwardly slanted portion 49, a horizontal portion 51, a downwardly-forwardly slanted stretch 52 and a horizontal foot 53 which is apertured and is connected to the module by the same screws 17 which attach the card 13 to spacer 16. The forward edge of foot 53 is formed with a downward bent edge 61 and the lower end of edge 61 is formed with a rearward bend 62 which catches under the forward edge of card 13. To prevent damage to card 13, downward struck stops 64 may be formed in forward foot 53 to limit rearward movement of bend 62 (see left side of FIG. 1). For air cooling purposes and as best shown in FIG. 5, longitudinally extending slots 56, 57, and 58 are formed in shroud portions 47, 49, and 52 respectively. Since the sides of module 11 are open, air to dissipate heat from the components 21, 26, and heat sinks 27 flows in numerous directions, and specifically through the ends and through the slots 56, 57, 58.

Figure 8:
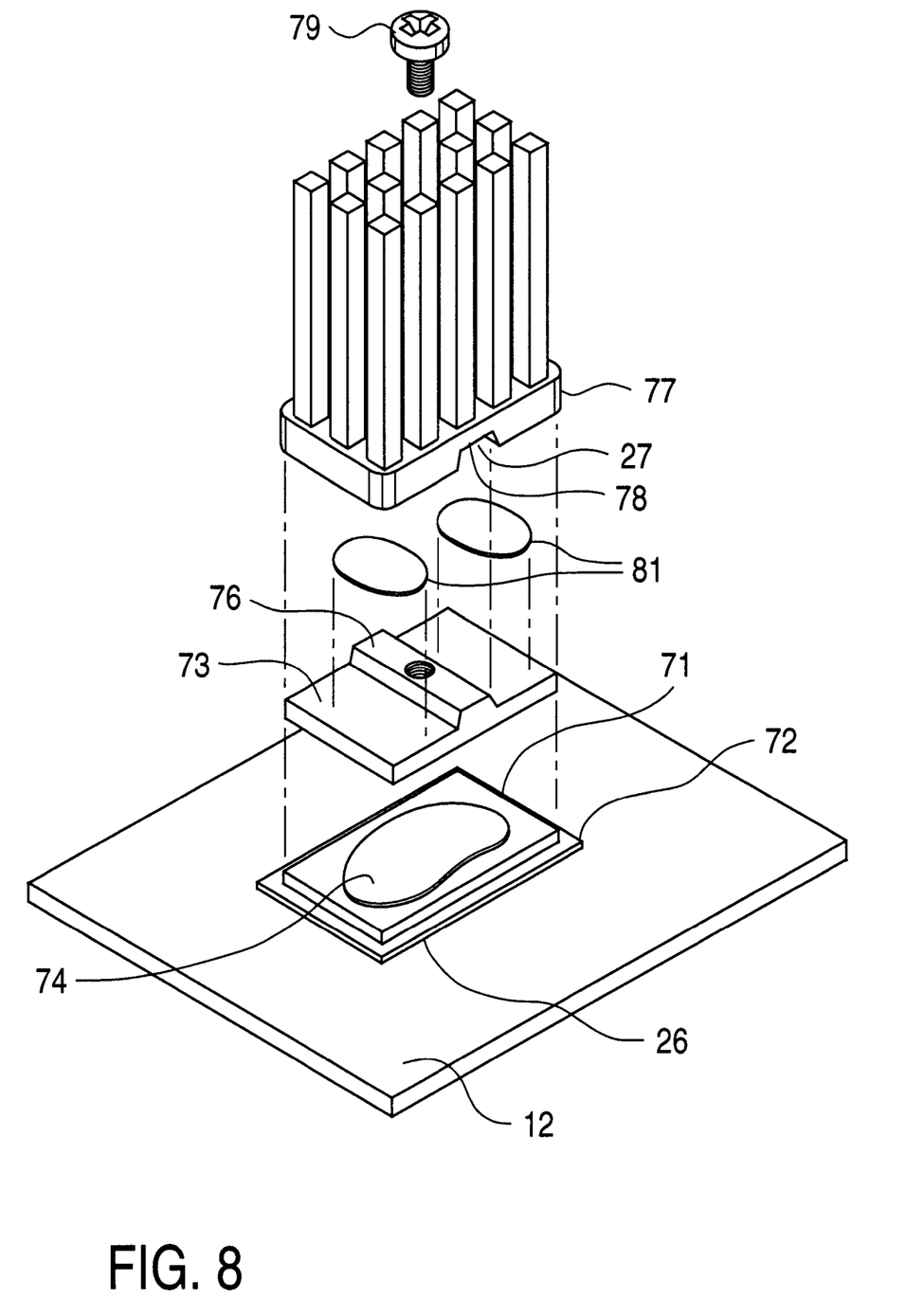
FIG. 8 is an exploded perspective view of the attachment of a heat sink to an electronic component used in the present invention.

Features of the attachment of heat sink 27 to component 26 are illustrated in FIG. 8. Thus, card 12 (or in some instances card 13 or other PCB) is a mounting for chip 71 or other heat emitting electrical components. Preferably the chip 71 is connected to the card 12 by a ball grid array 72. A heat spread slug 73 is mounted to the top of BGA 72 by epoxy 74 or other adhesive. The upper surface of slug 73 is formed with a tongue 76. Base 77 of heat sink 27 is formed with a groove 78 which mates with the tongue 76. Screw 79 attached base 77 to slug 73 and preferably the thermal conductivity between the two parts is enhanced by thermal grease 81.

OPERATION

Cards 12 and 13 and their various components are mounted with spacer 16 there between. Rearward bend 62 is inserted under the forward edge of card 13, foot 53 being attached by screws 17 to spacers 16. The rearward foot 46 of shroud 14 is then attached similarly by means of screws 17.

The module may be gripped by shroud 14. In order to insert the module, second rearward extension 32 is inserted in slots 37 of vertical panel 36. Preferably EMI material in the space between panel 36 and upward bent portion 41 blocks emissions. The rearward movement of module 11 enables the horizontal connectors 19 to mate with connectors (not shown) mounted on a mother board (not shown). The aforesaid attachment requires that the module 11 be inserted in a downwardly-rearwardly slanted position. By pressing down on horizontal portion 51 with the palm of the hand, the module is pivoted from an upwardly-rearwardly slanted position to a horizontal position. Simultaneously, the vertical connectors 19 engage the mating connectors (not shown) below the module. As has been stated, the open ends of the module and the slots 56–58 in shroud 14 provide for adequate air flow. The shape of the shroud 14 adjacent its forward edge is ergonomically contoured to fit the palm of the user and also provide for an easy grip for installation and removal of the module.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A module comprising a board containing heat-emitting components, one of said components having a heat sink thereon, and an enclosure above said board, said module having a rearward and a forward end, said enclosure comprising a thin member of substantially uniform thickness throughout its entire length and having a rear foot at said rearward end, a first elevated portion at an elevation above and forward of said rear foot, a second elevated portion above and forward of said first elevated portion and a forward foot forward of said second elevated portion substantially at the elevation of said rear foot, and fasteners attaching said front and rear feet to said board, each of said first and second elevated portions being positioned above said components by a space sufficient to accommodate said heat sink.

2. A module according to claim 1 in which said enclosure further comprises an upward-forward first slanted portion interconnecting said rear foot and said first elevated portion, an upward-forward second slanted portion interconnecting said first elevated portion and said second elevated portion, and a downward-forward third slanted portion interconnecting said second elevated portion and said forward foot, the external shapes of said second slated portion, said second horizontal portion and said third slanted portion shaped complementary to the palm of the hand of one installing or removing said module to help said one installing or removing said module to grip said module and guide said module.

3. A module according to claim 2 in which at least one of said slanted portions is formed with air-circulation slots.

4. A module according to claim 3 in which said second elevated portion is formed with extensions of said air-circulation slots.

5. A module according to claim 3 in which ends of said enclosure are open for air circulation.

6. A module according to claim 2 in which said forward foot has a downward bent edge and said downward bent edge has a rearward bend underlying a forward edge of said board.

7. A module according to claim 1 which further comprises a second board below said first-mentioned board, said second board having second heat-emitting components, and spacers spacing said boards apart.

8. A module according to claim 7 in which said fasteners secure said enclosure, said first and said second boards and said spacers together.

9. A module according to claim 7 which further comprises a heat spread slug attached to one said second heat emitting component and a heat sink connected to said slug having fins having upward termini below said first-mentioned board.

10. A module according to claim 9 in which said slug and said heat sink are restrained from movement relative to each other.

11. A module according to claim 10 in which said slug has a top face and said heat sink has a bottom face engaging said top face, one said face having a tongue and the other said face having a groove shaped to mate with said tongue.

12. A module according to claim 9 in which said slug is permanently adhered to said second component and which further comprises second fasteners detachably securing said heat sink to said slug.

13. A module comprising first and second boards containing heat-emitting components, said first board being elevated above said second board, and an enclosure above said board, said module having a rearward and a forward end, said enclosure comprising a rear foot at said rearward end, a first elevated portion at an elevation above and forward of said rear foot, a second elevated portion above and forward of said first elevated portion and a forward foot forward of said second elevated portion substantially at the elevation of said rear foot, and fasteners attaching said front and rear feet to said first board, said second board further compromising a rearward extension beyond a rear end of said second board, a first connector member horizontally disposed adjacent said extension and a second connector member vertically disposed adjacent a forward end of said module.

14. A module comprising a board containing heat-emitting components and an enclosure above said board, said module having a rearward and a forward end, said enclosure comprising a rear foot at said rearward end, a first elevated portion at an elevation above and forward of said rear foot, a second elevated portion above and forward of said first elevated portion and a forward foot forward of said second elevated portion substantially at the elevation of said rear foot, and fasteners attaching said front and rear feet to said card, said board further comprising a rearward extension beyond a rear end of said board, a first connector member horizontally disposed adjacent said extension and a second connector member vertically disposed adjacent a forward end of said module, and a panel transverse to said board formed with a slot shaped to receive said extension, said extension fitting through said slot.

15. The combination of claim 14 in which said extension has an upward disposed portion rearward of said panel.

16. The combination of claim 15 which further comprises EMI insulation between said upward disposed portion and said panel.

17. A module comprising a board containing heat-emitting components and an enclosure above said board, said module having a rearward and a forward end, said enclosure comprising a rear foot at said rearward end, a first elevated portion at an elevation above and forward of said rear foot, a second elevated portion above and forward of said first elevated portion and a forward foot forward of said second elevated portion substantially at the elevation of said rear foot, and fasteners attaching said front and rear feet to said card, said board further comprising a rearward extension beyond a rear end of said board, a first connector member horizontally disposed adjacent said extension and a second connector member vertically disposed adjacent a forward end of said module, and a panel transverse to said board formed with a slot shaped to receive said extension, said extension fitting through said slot, said extension and said panel having a pivot axis whereby said extension may be inserted through said slot with said module slanted downward-rearward and then pivoted about said pivot axis to horizontal position.

* * * * *